(12) United States Patent
Vali et al.

(10) Patent No.: US 7,936,606 B2
(45) Date of Patent: May 3, 2011

(54) COMPENSATION OF BACK PATTERN EFFECT IN A MEMORY DEVICE

(75) Inventors: Tommaso Vali, Sezze (IT); Violante Moschiano, Bacoli (IT); Giovanni Santin, Vazia (IT)

(73) Assignee: Micron Technology, Inc., Boise, ID (US)

( * ) Notice: Subject to any disclaimer, the term of this patent is extended or adjusted under 35 U.S.C. 154(b) by 307 days.

(21) Appl. No.: 12/108,067

(22) Filed: Apr. 23, 2008

(65) Prior Publication Data

US 2009/0135650 A1  May 28, 2009

(30) Foreign Application Priority Data

Nov. 28, 2007 (IT) .............................. RM2007A0621

(51) Int. Cl.
*G11C 11/34* (2006.01)

(52) U.S. Cl. ......... 365/185.09; 365/185.11; 365/185.18; 365/185.22; 365/185.24

(58) Field of Classification Search ............. 365/185.09, 365/189.05, 230.08
See application file for complete search history.

(56) References Cited

U.S. PATENT DOCUMENTS

| | | | | |
|---|---|---|---|---|
| 6,128,229 A | * | 10/2000 | Nobukata | 365/185.22 |
| 6,882,569 B2 | * | 4/2005 | Hosono et al. | 365/185.17 |
| 7,149,124 B2 | * | 12/2006 | Nazarian | 365/185.27 |

* cited by examiner

*Primary Examiner* — Pho M Luu
*Assistant Examiner* — Tha-O Bui
(74) *Attorney, Agent, or Firm* — Leffert Jay & Polglaze, P.A.

(57) ABSTRACT

In one or more of provided embodiments, a read operation is compensated for back pattern effect. A bit line current is generated by a read operation that biases the word lines. As part of a back pattern effect measurement phase, at predetermined time intervals an indication of the discharge status of the bit line is stored in a latch of a set of N latches coupled to each bit line. At the end of the measurement phase, the set of latches contains a multiple bit word that is an indication of the back pattern effect experienced by that particular series string of memory cells. This back pattern effect indication is used in subsequent read operations to adjust the timing of the operation.

20 Claims, 8 Drawing Sheets

|  | EN(t1) | EN(t2) | EN(t3) | EN(t4) |
|---|---|---|---|---|
| Latch(t1) | Store value at t1 | Hold value at t1 | Hold value at t1 | Hold value at t1 |
| Latch(t2) | x | Store value at t2 | Hold value at t2 | Hold value at t2 |
| Latch(t3) | x | x | Store value at t3 | Hold value at t3 |
| Latch(t4) | x | x | x | Store value at t4 |

COMPENSATION OF BACK PATTERN EFFECT IN A MEMORY DEVICE

RELATED APPLICATION

This application claims priority to Italian Patent Application Serial No. RM2007A000621, filed Nov. 28, 2007, entitled "COMPENSATION OF BACK PATTERN EFFECT IN A MEMORY DEVICE," which is commonly assigned.

TECHNICAL FIELD

The present disclosure relates generally to semiconductor memory and more particularly in one or more embodiments to non-volatile memory devices.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

FIG. 1 illustrates a schematic diagram of a portion of a typical prior art NAND architecture memory array comprising series strings of non-volatile memory cells. The array is comprised of an array of non-volatile memory cells 101 (e.g., floating gate) arranged in columns or series strings 104, 105. Each of the cells 101 are coupled drain to source in each series string 104, 105. A word line WL0-WL31 that spans across multiple series strings 104, 105 is coupled to the control gates of each memory cell in a row in order to control their operation in response to biasing of the bit lines. The bit lines BL1, BL2 are eventually coupled to sense amplifiers (not shown) that detect the state of each cell by sensing current on a particular bit line.

Select lines, such as word lines WL0-WL31, select the individual memory cells in the series strings 104, 105 to be written to or read from and operate the remaining memory cells in each series string 104, 105 in a pass through mode. Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of –0.5V might indicate an erased cell. The MLC may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

The resistance of a series string of memory cells varies in response to the programmed pattern of the memory cells above a target cell in the series string. A change in resistance causes the bit line discharge rate to change, resulting in the appearance of a higher threshold voltage for a read cell.

FIG. 2 illustrates a schematic diagram of an equivalent circuit representing one of the NAND memory cell strings in accordance with FIG. 1. The equivalent circuit is comprised of the bit line 201 that is coupled to the memory cell series string equivalent 200. The string equivalent 200 is comprised of a select gate drain transistor 204 that couples the string to the bit line 201. A select gate source transistor 205 couples the string 200 to the source line 202. A target memory cell 209 is the memory cell of the string that is selected to be programmed or read. In the illustrated embodiment, the target transistor 209 is at the bottom of the string 200 closest to the source line 202.

A resistance 207 represents the sum, $R_S$, of all of the resistances of the memory cells in the NAND string 200 between the target memory cell 209 and the select gate drain transistor 204 (i.e., above the selected cell). The capacitance 208 represents the total capacitance of the memory cells of the NAND string 200 above the selected memory cell 209.

In a typical prior art sensing operation, the series string of memory cells is initially precharged from the bit line 201 to which it is coupled. An attempt is then made to discharge the series string current through the target cell to be read/verified. If the target cell is erased, the string discharges. If the cell is programmed, the string does not discharge. This scheme is used to determine the state of a target cell.

When writing to the target cell 209, all of the memory cells in the string above it are normally erased since programming of a memory string typically begins at the bottom cell. In this case, $R_S$ is small resulting in a higher bit line current during the verify operation.

In a worst case scenario, all of the cells in the string 200 above the target cell 209 are then programmed, thus increasing $R_S$. With an increased $R_S$, the bit line current decreases and a read operation of the target cell 209 might appear to have a threshold voltage that is outside of the programmed state. In any case, the increase of the resistance of the series string of memory cells when programmed will add a certain level of millivolts that opens the $V_t$ distribution window and makes it appear that the read cell has a higher threshold voltage than what was programmed. Since the series resistance varies due to the different, unknown programmed states of the cells above the selected cell, the amount of change in $V_t$ cannot be predicted.

For the reasons stated above, and for other reasons which will become apparent to those skilled in the art upon reading and understanding the present specification, there is a need in the art for compensation of this back pattern effect in a memory device.

BRIEF DESCRIPTION OF THE DRAWINGS

FIG. 5 shows a table of latch programming in accordance with the block diagram of FIG. 3.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
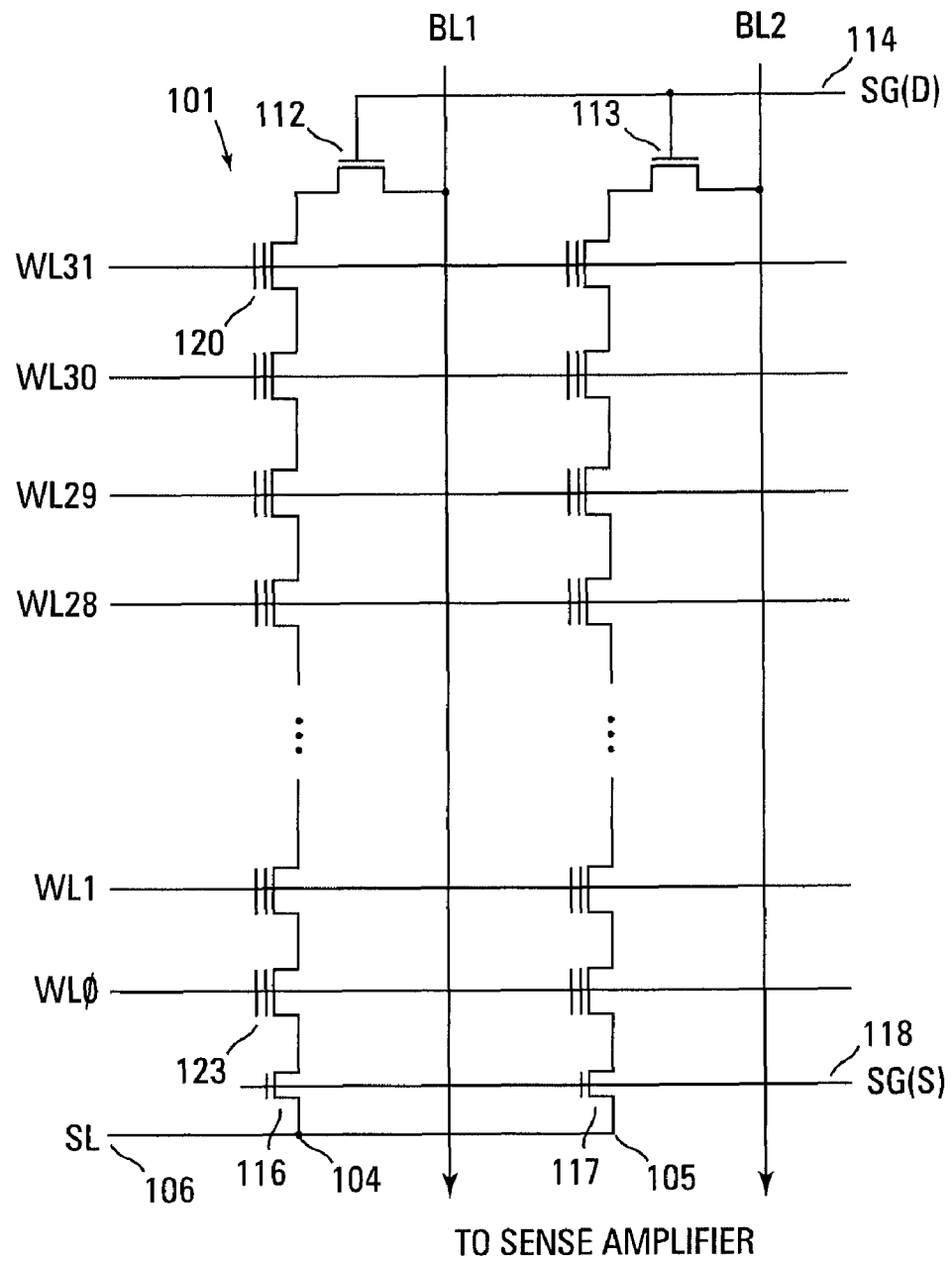
FIG. 1 shows a typical prior art series string of memory cells of a memory array organized in a NAND architecture.
Figure 2:
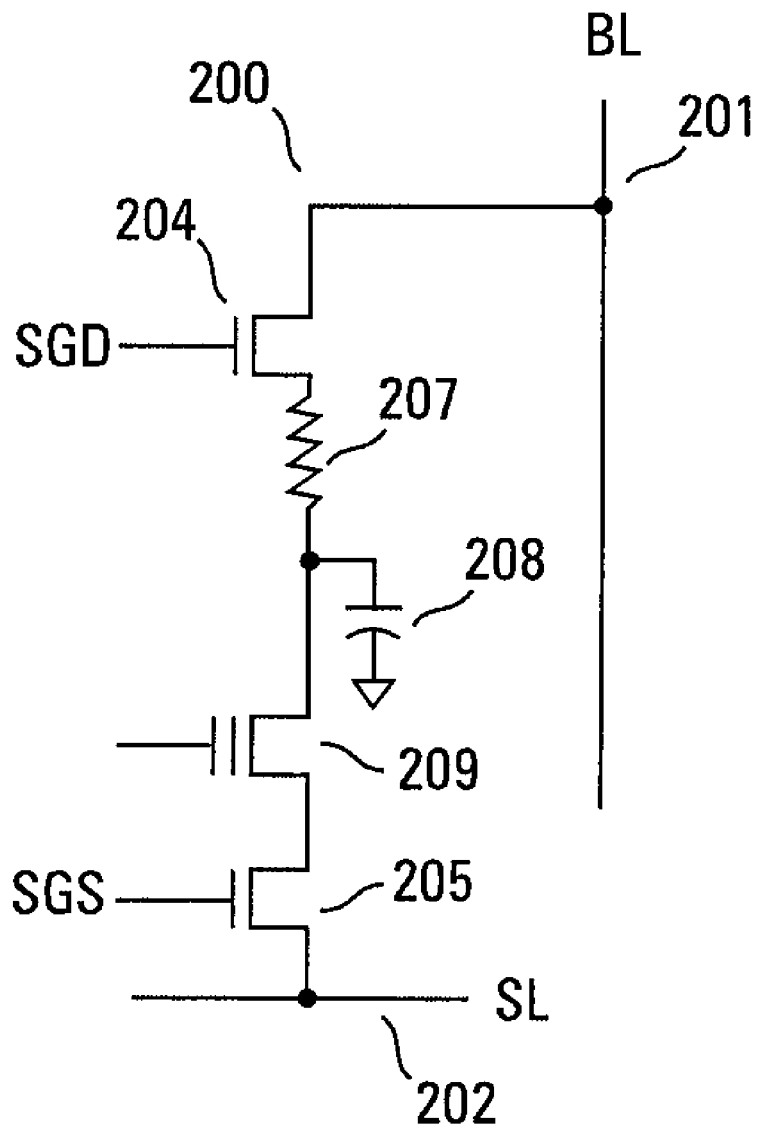
FIG. 2 shows a schematic diagram of one embodiment of a prior art representation of the NAND series string of FIG. 1.
Figure 3:
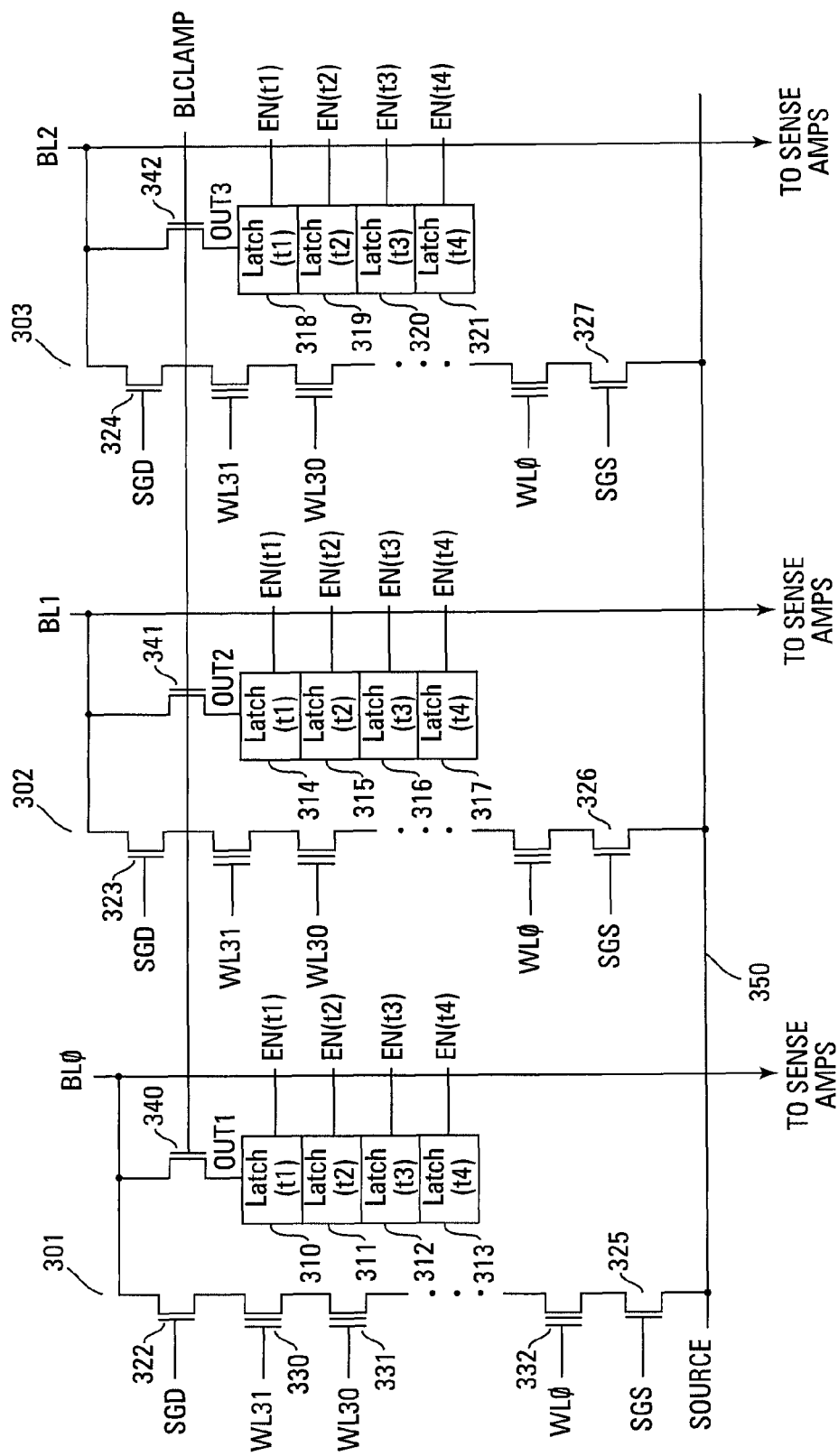
FIG. 3 shows a block diagram of one embodiment of a circuit for compensating for the back pattern effect of a NAND series string of memory cells.

FIG. 3 illustrates a block diagram of one embodiment of a circuit for compensating for the back pattern effect in a series string of memory cells. While the present disclosure focuses on NAND architecture non-volatile memory devices, alternate embodiments can use other types of memories and other memory architectures. For purposes of clarity, FIG. 3 illustrates only three series strings 301-303 of a memory array that might contain thousands of series strings, each coupled to its respective bit line BL0, BL1, BL2.

Each series string of memory cells 301-303 is comprised of a select gate drain transistor 322-324 and a select gate source transistor 325-327. The select gate drain transistors 322-324 control access of each series string of memory cells to its respective bit line BL0-BL2 while the select gate source transistors 325-327 control access of each series string of memory cells to the source line 350.

In the illustrated embodiment, each series string of memory cells 301-303 is comprised of thirty-two memory cells. Each memory cell is coupled to a word line WL0-WL31. Each word line WL0-WL31 is coupled to a page of data in a memory block wherein each word line is coupled to a number of separate series strings of memory cells. Alternate embodiments can use other quantities of bit lines and memory cells.

Each bit line is coupled to N latches 310-321 for each page buffer. The quantity of latches used on each bit line depends on the level of back pattern reduction to be achieved. The greater the back pattern reduction necessary, the more latches required. Therefore, N is the discrete value of the different steps of back pattern to be measured. For purposes of illustration, FIG. 3 and the following discussion of the present embodiments assumes N=4.

Each latch is coupled to an enable line EN(t1)-EN(t4). The latches are isolated from their respective bit lines by a control transistor 340-342 that are all controlled by the BLCLAMP signal. The N latches 310-321 of each bit line of FIG. 3, depending on how they are programmed, detect varying amounts of bit line discharge time during a read operation as indicated by the OUTx signals (i.e., OUT1, OUT2, OUT3).

After each BLCLAMP strobe on its respective control transistor 340-341, the OUTx signal is going to be a "0" if the bit line is discharged. If the OUTx signal is a "1" after the BLCLAMP strobe, the respective bit line is not discharged. The OUTx signal is latched into the respective bit line latches after each strobe as shown in the timing diagram of FIG. 6 and described subsequently.

Figure 4:
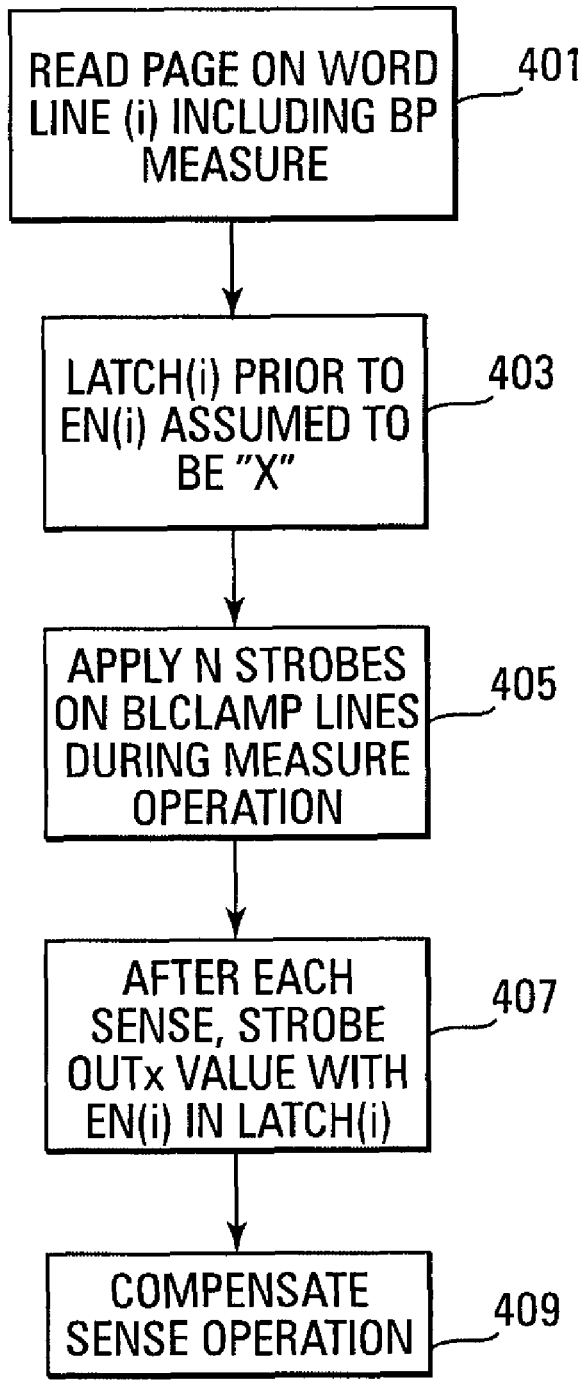
FIG. 4 shows a flowchart of one embodiment of a method for operating a memory device to reduce the back pattern effect.

FIG. 4 illustrates a flowchart of one embodiment of a method for operating a non-volatile memory device to reduce the back pattern effects. Initially, the page of data on selected word line (i) is read 401. The read operation 401 is performed with an additional operation to measure the back pattern effect. The entire operation is comprised of reading word lines starting at the selected word line and up to the word line next to the select gate drain transistor. This is denoted as word lines (i)-31. These word lines (i)-31 are biased with a $V_{pass\_read}$ voltage (e.g., approximately 5.5V). The remaining word lines from (i-1) and below to the select gate source transistor are biased with a $V_{pass\_read+\Delta V}$ voltage (e.g., approximately 6.0V). This operation ensures that all word lines below the selected word line (i) to be programmed are completely turned on.

The N latches on each bit line, as illustrated in FIG. 3, are assumed to be in a "do not care" state that is typically denoted as "X" 403. During the back pattern measurement phase, N strobes are generated on the BLCLAMP line 405. These strobes are referred to as BLCLAMP(1), BLCLAMP(2), BLCLAMP(3), and BLCLAMP(4) in the timing diagram of FIG. 6. Each BLCLAMP(i) strobe turns on the control transistors 407 (340-342 of FIG. 3) so that, after each sense operation, the OUTx value will be presented to the input of the respective bit line latches to be clocked in with the appropriate EN(i) signal, as shown in the timing diagram of FIG. 6. The final value of the N latches for each bit line is then used to compensate the sensing operation 409 as discussed subsequently.

FIG. 5 illustrates a table of one embodiment of programming for the N latches. Each row is the LATCH(i) value that was latched in at the times of the enable signals EN(i) in the columns. The contents of this table will be described subsequently in conjunction with the timing diagram of FIG. 6.

Figure 6:
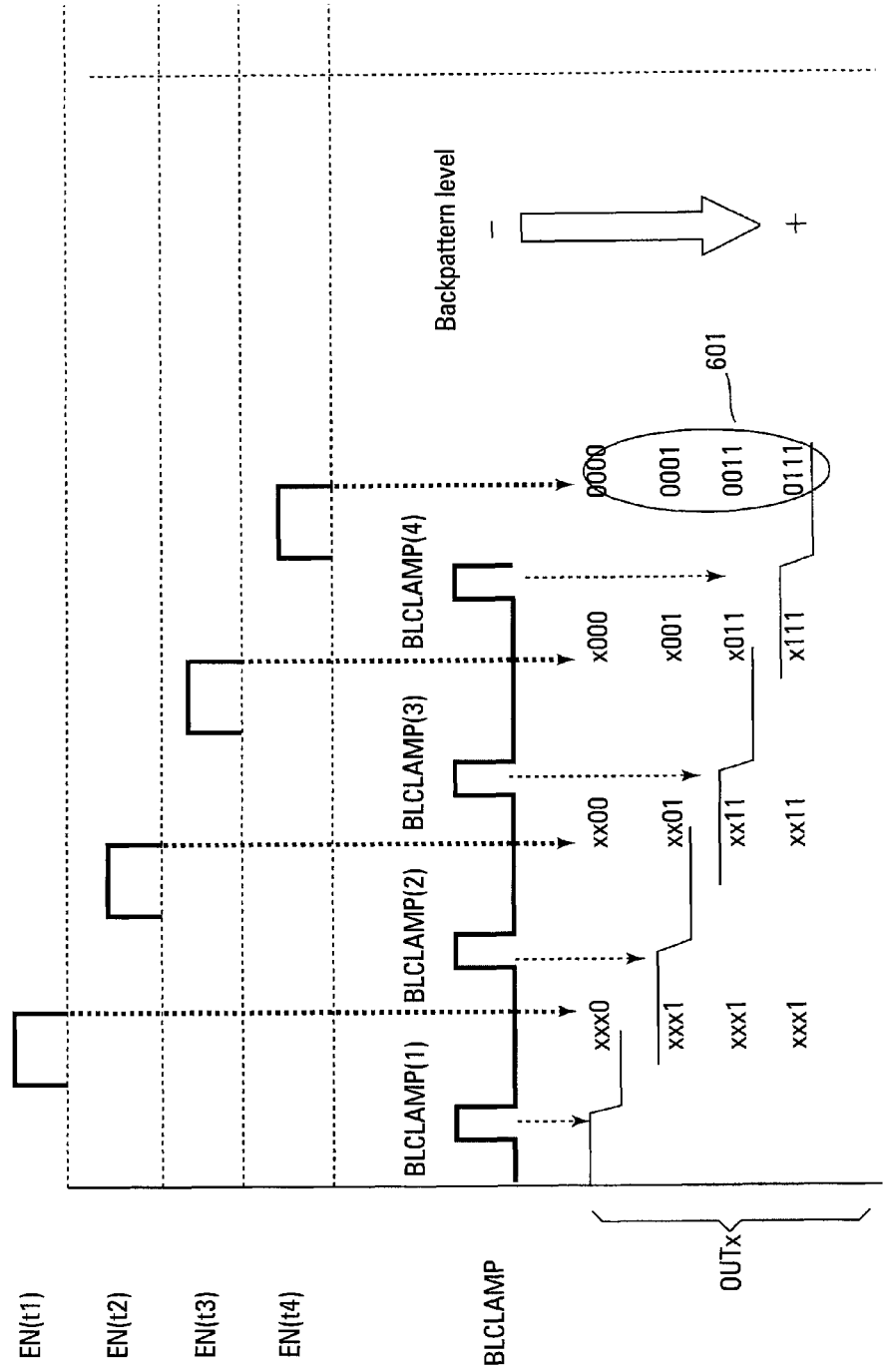
FIG. 6 shows a timing diagram of one embodiment of timing signals for operation of the circuit of FIG. 3.

FIG. 6 illustrates the timing diagram of the circuit of FIG. 3 and the table of FIG. 5. The initial enable pulse, EN(t1), at time t1 occurs after the control transistor 340 is turned on by the BLCLAMP(1) strobe. This latches the state of the OUT1 signal, at time t1, into LATCH(t1) as shown in the first column of FIG. 5. If the bit line has been discharged by time t1, OUT1 is a logical "0". If the bit line has not been discharged yet by time t1, OUT1 is a logical "1". The timing diagram shows that the latching occurs on the falling edge of EN(i). Alternate embodiments can latch the OUTx value at different times.

The EN(t2) pulse occurs at time t2 after the control transistor 341 is enabled by the BLCLAMP(2) strobe. The EN(t2) pulse latches the state of the OUT2 signal, at time t2, into LATCH(t2) as shown in the second column of FIG. 5. If the bit line has been discharged by time t2, OUT2 is a logical "0". If the bit line has not been discharged yet by time t2, OUT2 is a logical "1".

The EN(t3) pulse occurs at time t3 after the control transistor 342 is enabled by the BLCLAMP(3) strobe. The EN(t3) pulse latches the state of the OUT3 signal, at time t3, into LATCH(t3) as shown in the second column of FIG. 5. If the bit line has been discharged by time t3, OUT3 is a logical "0". If the bit line has not been discharged yet by time t3, OUT3 is a logical "1".

Even though a fourth series string of memory cells is not shown in FIG. 3 for purposes of clarity, if it is assumed that N=4, then the EN(t4) pulse occurs at time t4 after the control transistor is enabled by the BLCLAMP(4) strobe. The EN(t4)

pulse latches the state of an OUT4 signal, at time t4, into LATCH(t4) as shown in the second column of FIG. 5. If the bit line has been discharged by time t4, OUT4 is a logical "0". If the bit line has not been discharged yet by time t4, OUT4 is a logical "1".

By the end of the four EN(i) pulses, the back pattern measurement phase is complete and each set of N latches for each bit line now contain the indication of the back pattern effect experienced on each respective bit line. In the present embodiment, this indication can range from "0000" to "0111" (assuming N=4) as shown in FIG. 6. The value 601 stored in each latch is shown in FIG. 6 at the end of the back pattern measurement phase.

The lowest back pattern level is represented by the "0000" value since this indicates that the bit line has been discharged since time t1 (i.e., discharged more rapidly than other bit lines). In other words, the lower resistance of the series string of memory cells provides for a faster discharge rate during the sense operation.

The greatest back pattern level is represented by the "0111" value since this indicates that the bit line has taken until time t4 in order to fully discharge. In other words, the higher resistance of the series string of memory cells provides for a slower discharge rate during the sense operation.

Figure 7:
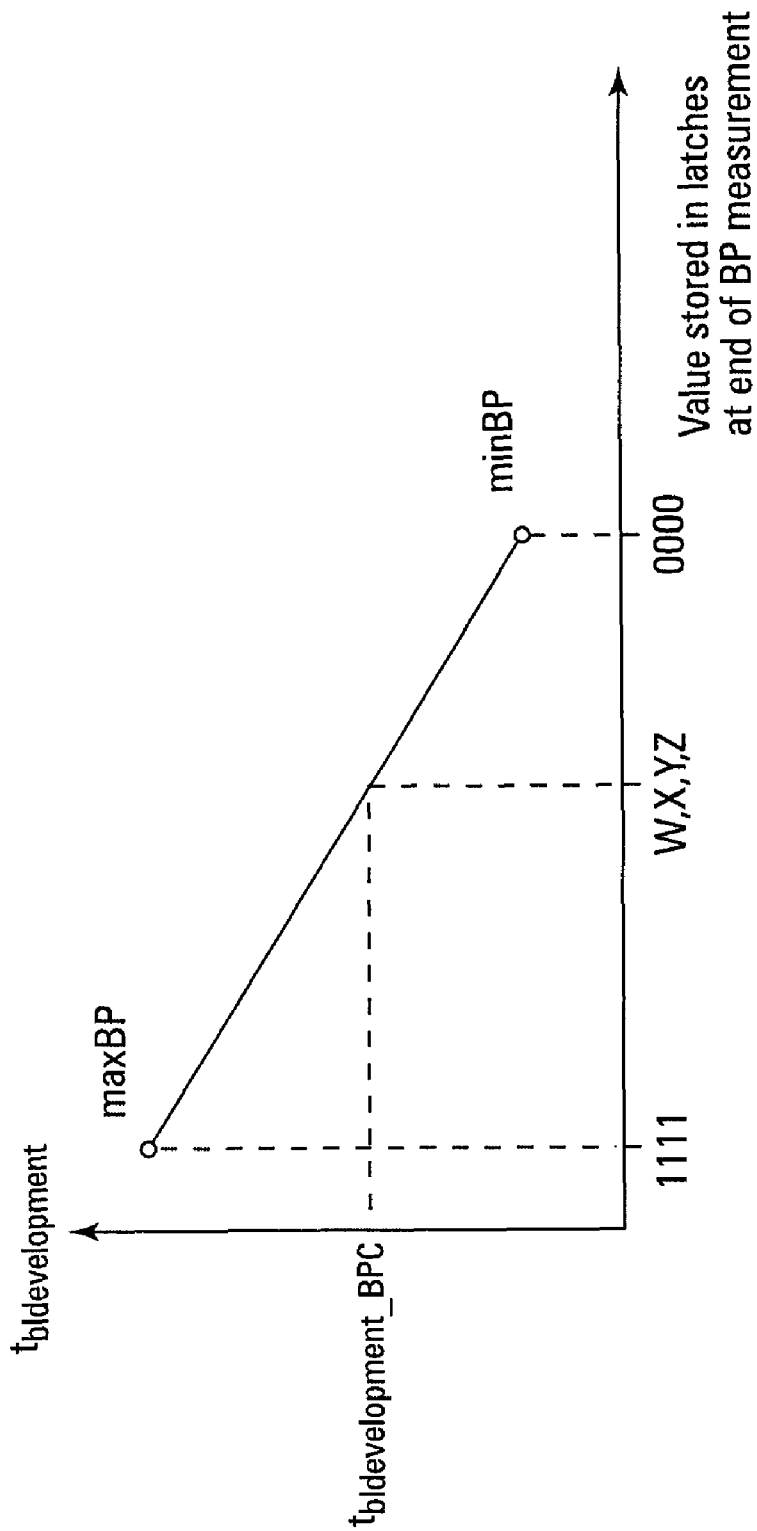
FIG. 7 shows a plot of time for back pattern development versus a measured level of the back pattern effect.

FIG. 7 illustrates a plot of time for back pattern development ($t_{bldevelopment}$) versus the back pattern level indication that was just measured. This plot provides the amount of compensation required for different measured back pattern levels. The plot shows that the maximum back pattern level, maxBP, (i.e., "1111") is at the left side while the minimum back pattern level, minBP, (i.e., "0000") is at the right side of the plot.

The compensation is comprised of using the N bits stored in the N latches to adjust the $t_{bldevelopment}$ time used during the read operation. The $t_{bldevelopment}$ time is during which the bit line back pattern time is developed. A random point is chosen on the curve that indicates the amount of back pattern compensation ($t_{bldevelopment\_BPC}$) required at some back pattern effect level W,X,Y,Z. The more a series string of memory cells is affected by back pattern, the more time compensation, $t_{bldevelopment\_BPC}$, necessary during a read operation to adjust its apparent $V_t$.

The apparent $V_t$ is a result of the $V_t$ appearing to be greater than it actually is due to the increased time required during a sense operation as a result of the increased resistance in the series string. During the sense operation, the memory device determines the read time (i.e., the actual time required for bit line discharge) and decreases it by $t_{bldevelopment\_BPC}$ prior to determining the current state of the memory cell being read.

Figure 8:
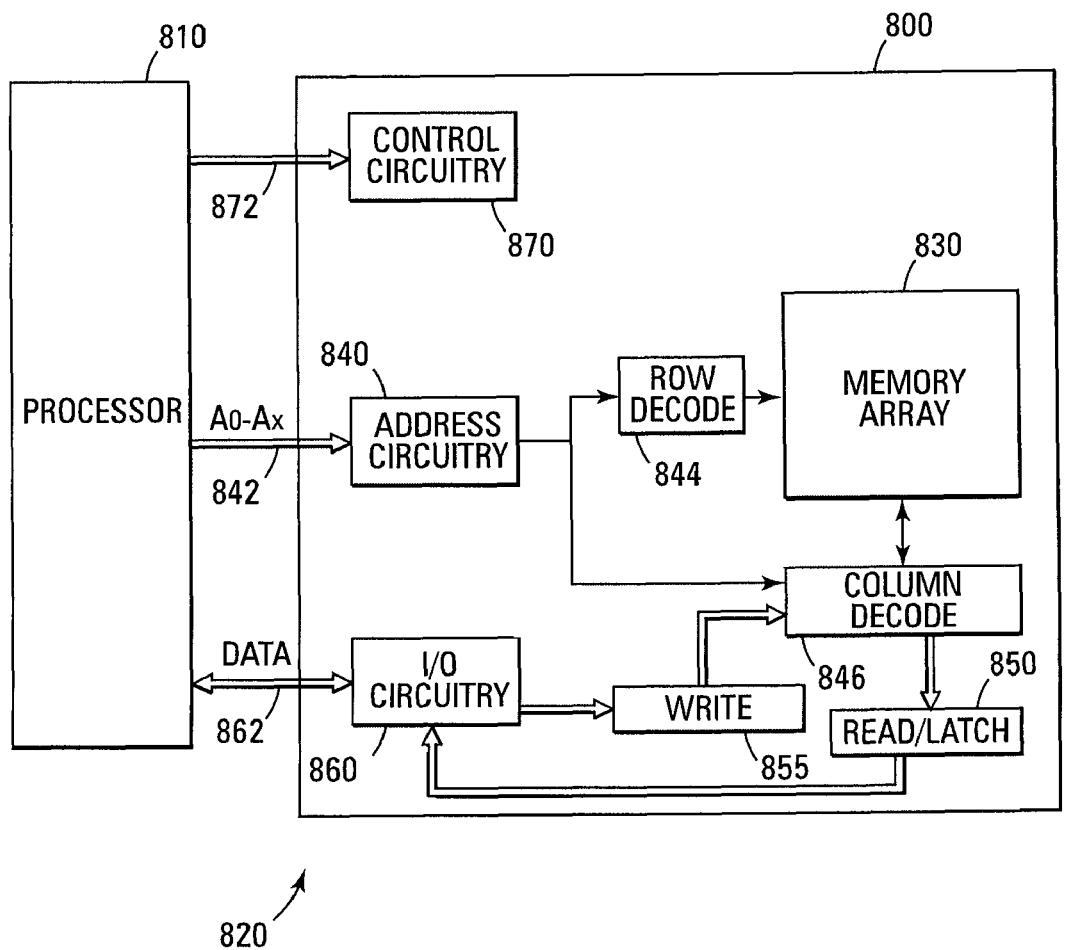
FIG. 8 shows a block diagram of one embodiment of a memory system of the present disclosure.

FIG. 8 illustrates a functional block diagram of a memory device 800 that can incorporate the non-volatile memory cells of the present embodiments. The memory device 800 is coupled to a processor 810. The processor 810 may be a microprocessor or some other type of controlling circuitry. The memory device 800 and the processor 810 form part of a memory system 820. The memory device 800 has been simplified to focus on features of the memory that are helpful in understanding the present embodiments.

The memory device includes an array of flash memory cells 830 or some other type of non-volatile memory cells. The memory array 830 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier/buffer circuitry 850. The sense amplifier/buffer circuitry, in one embodiment, is coupled to read and latch a row of data from the memory array 830. Data input and output buffer circuitry 860 is included for bi directional data communication over a plurality of data connections 862 with the controller 810. Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller. The control circuitry 870 is adapted to execute the embodiments of the back pattern effect compensation method.

The non-volatile memory device illustrated in FIG. 8 has been simplified to facilitate a basic understanding of the features of the memory and is for purposes of illustration only. A more detailed understanding of internal circuitry and functions of non-volatile memories are known to those skilled in the art.

CONCLUSION

The embodiments of the present disclosure provide a time compensation factor, used during a sense operation, in response to a measured back pattern level. The back pattern level is measured during a read operation in order and a multiple bit word is generated that indicates the amount of back pattern affecting a series string of memory cells. The greater the measured back pattern level, the longer the time for bit line discharge, thus indicating a larger resistance in the series string of memory cells. The longer the time for discharge, the more the effect on the apparent $V_t$ of the sense memory cell and, thus, the greater the need for compensation on the sensing time.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method for generating back pattern effect compensation in a memory device, the method comprising:
   measuring a back pattern effect level in a series string of memory cells;
   generating an indication of the back pattern effect level; and compensating a read operation of the series string of memory cells in response to the indication.

2. The method of claim 1 wherein the indication is a series of bits such that each bit indicates a different time of discharge of a bit line coupled to the series string of memory cells.

3. The method of claim 1 wherein generating the indication comprises generating a plurality of bits wherein each bit indicates a discharge state of a bit line coupled to the series string of memory cells.

4. The method of claim 1 wherein measuring the back pattern effect level comprises generating a bit line current with a read operation.

5. The method of claim 1 wherein the memory device is a NAND flash memory device.

6. The method of claim 1 and further including:
performing a read operation that comprises biasing all word lines in the series string of memory cells, from a selected word line to a word line closest to a select gate drain line, with a first bias voltage; and
biasing all word lines below the selected word line with a second bias voltage that is greater than the first bias voltage.

7. A method for generating back pattern effect compensation in a non-volatile memory device, the method comprising:
performing a sense operation on a series string of memory cells that is coupled to a bit line such that a bit line current is generated;
generating a multiple bit word wherein each bit indicates a discharge status of the bit line during a different time period such that each bit is generated independently after each time period;
reading a selected memory cell of the series string of memory cells; and
compensating the reading in response to the multiple bit word wherein an increasing amount of back pattern effect results in a reduction of reading sense time.

8. The method of claim 7 wherein generating the multiple bit word comprises generating a strobe signal that controls output of each bit of the multiple bit word from the series string of memory cells.

9. The method of claim 8 and further including latching each bit of the multiple bit word into a latch after each time period.

10. The method of claim 9 and further comprising generating an enable signal after each strobe signal wherein the enable signal initiates the latching of each bit.

11. The method of claim 8 wherein each series string of memory cells is comprised of N latches and generating the multiple bit word further comprises generating N strobe signals.

12. A method for compensating a read operation for back pattern effects in a NAND flash memory device having a plurality of series strings of memory cells each coupled to a bit line, each series string coupled to N latches, the method comprising:
performing a read operation on a first series string of memory cells to generate a bit line current, the read operation comprising:
biasing each word line from a selected word line to a word line closest to a select gate drain line with a first voltage; and
biasing each word line below the selected word line to the word line closest to a select gate source line with a second voltage that is greater than the first voltage;
generating N strobe signals to enable a control transistor between the N latches and the series string of memory cells such that N bit line discharge status output signals are produced;
generating N enable signals to latch each of the N bit line discharge status output signals into the N latches to produce a back pattern effect level indication; and
adjusting a read time during a subsequent read operation in response to the back pattern effect level indication.

13. The method of claim 12 wherein adjusting the read time comprises decreasing the read time in response to higher levels of back pattern effects.

14. The method of claim 12 wherein N represents a discrete value of different steps of back pattern effect.

15. A solid state memory device comprising:
an array of memory cells organized in rows of memory cells coupled to word lines and series strings of memory cells coupled to bit lines; and
a set of N latches coupled to each series string of memory cells, wherein each set of latches is adapted to store an indication of a back pattern effect experienced by its respective series string of memory cells.

16. The memory device of claim 15 and further comprising a control transistor that couples each set of N latches to each series string of memory cells.

17. The memory device of claim 15 and further comprising memory control circuitry coupled to the array of memory cells for generating a series of N enable signals that latch each of N bits into its respective latch.

18. The memory device of claim 15 and further comprising a processor external to the memory device and coupled to the memory device for controlling operation of a resulting memory system.

19. The memory device of claim 17 wherein the memory control circuitry is adapted to generate N strobe signals, each strobe signal enabling a control transistor that couples a set of N latches to its respective series string of memory cells.

20. The memory device of claim 15 wherein the indication of the back pattern effect comprises a multiple bit word wherein each bit comprises a bit line discharge status indication of its respective bit line.

* * * * *